United States Patent
Ho et al.

(10) Patent No.: US 7,336,935 B2
(45) Date of Patent: Feb. 26, 2008

(54) DYNAMIC POWER CONTROL CIRCUIT OF WIRELESS COMMUNICATION DEVICE

(75) Inventors: David Ho, Taipei (TW); Sheng Xiao, Shanghai (CN); Chih-Chung Hung, Shanghai (CN)

(73) Assignee: Inventec Appliances Corp., Taipei (TW)

( * ) Notice: Subject to any disclaimer, the term of this patent is extended or adjusted under 35 U.S.C. 154(b) by 408 days.

(21) Appl. No.: 11/155,719

(22) Filed: Jun. 20, 2005

(65) Prior Publication Data

US 2006/0057979 A1 Mar. 16, 2006

(30) Foreign Application Priority Data

Sep. 14, 2004 (TW) .............................. 93214622 U

(51) Int. Cl.
*H04B 1/04* (2006.01)
(52) U.S. Cl. ................ 455/127.3; 455/126; 455/127.2; 455/127.4; 455/241.1; 455/232.1; 330/278; 330/291
(58) Field of Classification Search ................ 455/126, 455/127.2, 127.3, 127.4, 241.1, 232.1; 330/278, 330/291
See application file for complete search history.

(56) References Cited

U.S. PATENT DOCUMENTS

| 4,353,037 A | * | 10/1982 | Miller ........................ 330/298 |
| 5,107,225 A | * | 4/1992 | Wheatley et al. ........... 330/279 |
| 5,465,205 A | * | 11/1995 | Kamiya ....................... 700/37 |
| 5,551,067 A | * | 8/1996 | Hulkko et al. ................ 455/88 |

* cited by examiner

*Primary Examiner*—Nay Maung
*Assistant Examiner*—Richard Chan
(74) *Attorney, Agent, or Firm*—Bacon & Thomas, PLLC

(57) ABSTRACT

The present invention is to provide a dynamic power control circuit for a wireless communication device, which comprises a power detector, a comparator, a low pass filter and an adder disposed between a radio frequency auto-gain control circuit and an antenna thereof. A reference voltage is imposed on the adder to enable the power detector to detect and output signal voltage to the comparator which compares the received voltage with a specified received voltage limit and outputs a reference voltage to the low pass filter for filtering out the noise of the reference voltage and outputting it to the adder. The adder then adds the reference voltage and the specified reference voltage, and outputs the result to the radio frequency auto-gain control circuit for controlling the output power corresponding to the strength of the received signals.

2 Claims, 2 Drawing Sheets

DYNAMIC POWER CONTROL CIRCUIT OF WIRELESS COMMUNICATION DEVICE

FIELD OF THE INVENTION

The present invention relates generally to a dynamic power control circuit for a wireless communication device, more particularly to an auto-gain control circuit of a wireless communication device which can control output power corresponding to the strength of received signals. When the received signal is weak, the output power is increased, so as to enhance the wireless communication quality. When the received signal is strong, the output power is reduced, so as to decrease power consumption and increase the speaking time on the wireless communication device.

BACKGROUND OF THE INVENTION

In recent years, the development of modern technology has forever changed the way people live. In particular, the overwhelming use of wireless communication devices has made the communication between people a much easier task. In addition, a variety of functions, such as game, phone book, voice mail system, calculator, alarm, wireless application protocol (WAP), text messaging, electronic mail, etc., has also been included in the wireless communication device to provide users with additional services. Following this trend, a multi-function wireless communication device is developed to satisfy the users' need.

Since more and more features are integrated into the wireless communication device, the requirement of battery capacity has also been increased. The capacity of the conventional lithium battery no longer sustains the normal usage of the wireless communication device, especially for the wireless fidelity (Wi-Fi) communication devices. Since the Wi-Fi communication device occurs a lot of power consumption, it is deemed necessary to develop low power consumption Wi-Fi communication devices.

Referring to FIG. 1, a signal emission circuit of a commercially available Wi-Fi communication device is illustrated. The signal emission circuit comprises a radio frequency (RF) auto-gain control circuit. The circuit includes a dynamic gain power amplifier 11, a power detector 12, a comparator 13, a low pass filter 14, wherein the output voltage $V_{DET}$ of detector 12 is proportional to the output power $P_{OUT}$ (in the unit of dBm (decibel per milliwatt)), F(S) is a function of the filter 14, Vc is the control voltage, and $V_{REF}$ is the reference voltage, the value of which is 15 dBm. In this manner, the detector 12 detects the output power $P_{OUT}$ of the amplifier 11, and outputs a voltage $V_{DET}$ after the detection of the detector 12. The output voltage $V_{DET}$ further is inputted into the comparator 13 and is compared with the reference voltage $V_{REF}$ (15 dBm). Later, the filter 14 filters out the noise of the control voltage Vc output from the comparator 13, thereby making the control voltage Vc be the control value of the gain of the amplifier 11.

With respect to the conventional Wi-Fi communication device, the output power is usually set to be 15 dBm. Therefore, the reference voltage $V_{REF}$ (15 dBm) is a reference voltage corresponding to 15 dBm. The basic principle of the auto-gain control circuit can thus be described by using the following formulae:

1) Output voltage $V_{DET}=A \times P_{OUT}$ (dBm), where A is the gain of the detector 12;
2) Control voltage $Vc=F(S)$ ($V_{REF}$ (15 dBm)$-V_{DET}$).

Consequently, if the output power is smaller than 15 dBm, $V_{DET}$ is smaller than $V_{REF}$, which makes Vc positive, thereby increasing the power amplification gain. The $P_{OUT}$ then approaches to the output power originally configured. On the contrary, if the output power reaches 15 dBm, Vc will become negative, which will decrease the power amplification gain. Finally, $P_{OUT}=15$ dBm.

According to the description set forth above, the conventional Wi-Fi communication device emits the radio frequency signals with the same power, regardless of the signal strength of where the Wi-Fi communication device is located. This gives rise to a poor talk quality when the signals are weaker (or even no signal is received). When the signal strength is stronger, a lot of battery power is wasted, which gives rise to a shorter usage time. For this reason, it is deemed necessary to develop a Wi-Fi communication device that consumes less power, so as to overcome the conventional drawbacks.

SUMMARY OF THE INVENTION

In light of the drawbacks of high power consumption and shortening speaking time for a conventional Wi-Fi communication device described above, the inventors of the present invention has studied and experimented all possible solutions thereof, and finally developed a dynamic power control circuit of the present invention, so as to overcome the drawbacks of the conventional wireless communication device.

It is an object of the present invention to provide a dynamic power control circuit to reduce the power consumption and increase speaking time of a wireless communication device. The wireless communication device comprises a radio frequency (RF) auto-gain control circuit. The auto-gain control circuit includes a dynamic gain power amplifier, a power detector, a comparator, and a low pass filter, wherein another power detector, another comparator, another low pass filter and an adder are disposed between the comparator and the antenna of the wireless communication device. A reference voltage is imposed on the adder, so as to enable the another power detector to detect the signal voltage received from the antenna, and output the received voltage to the another comparator. The another comparator compares the received voltage with a specified received voltage limit, and outputs a reference voltage to the another low pass filter. The another low pass filter filters out the noise of the reference voltage and outputs the reference voltage to the adder. The adder adds the reference voltage and the specified reference voltage, and outputs the result to the comparator. In this manner, the auto-gain control circuit can control the output power corresponding to the strength of the received signals. When the received signal is weak, the output power accordingly is increased, so as to enhance the phone connecting quality. When the received signal is strong, the output power accordingly is reduced, so as to decrease power consumption and increase the speaking time on the phone.

The above and other objects, features and advantages of the present invention will become apparent from the following detailed description taken with the accompanying drawings.

DETAILED DESCRIPTION OF THE PREFERRED EMBODIMENTS

Figure 1:
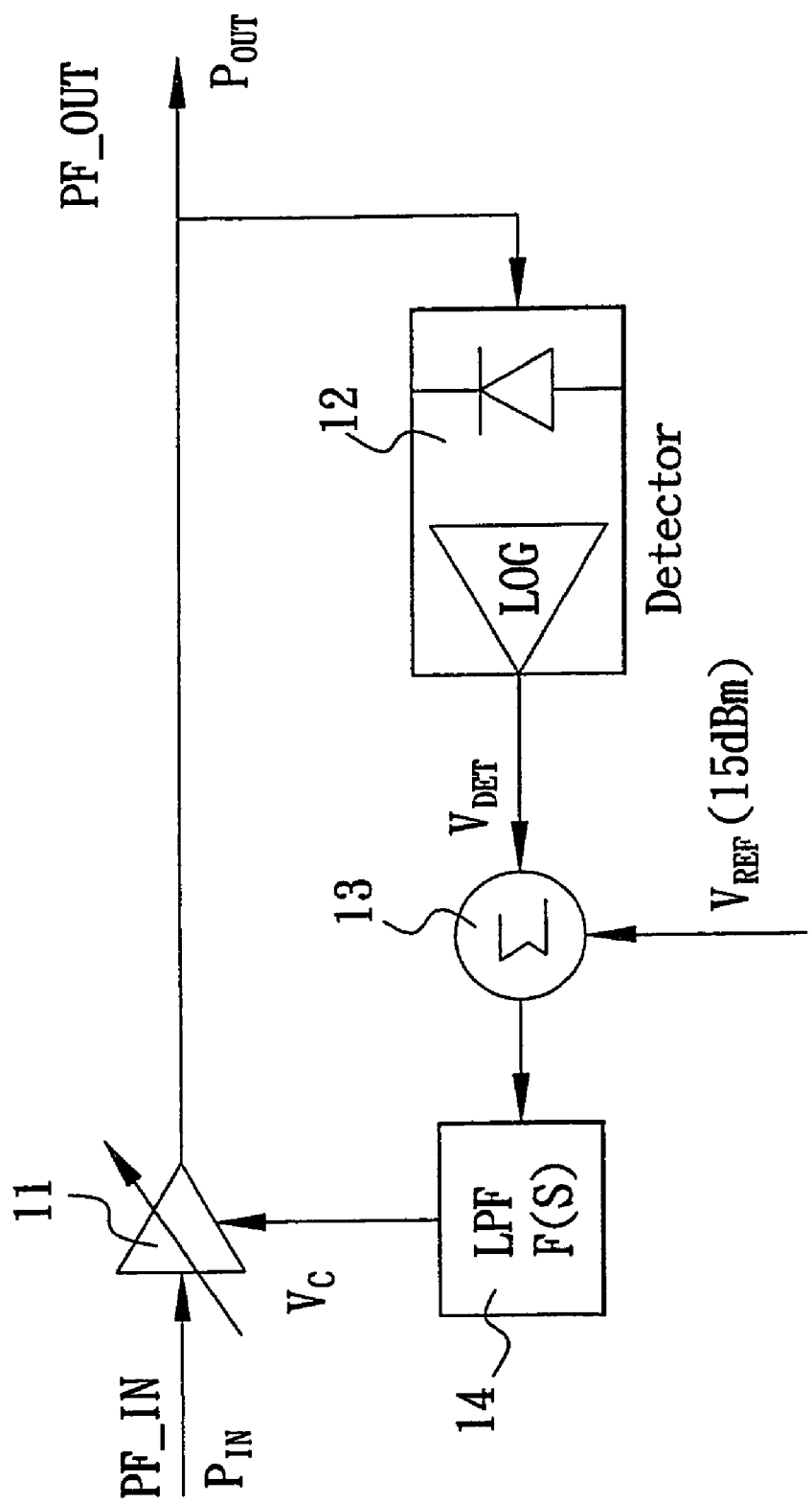
FIG. 1 illustrates a conventional auto-gain control circuit of a Wi-Fi communication device.
Figure 2:
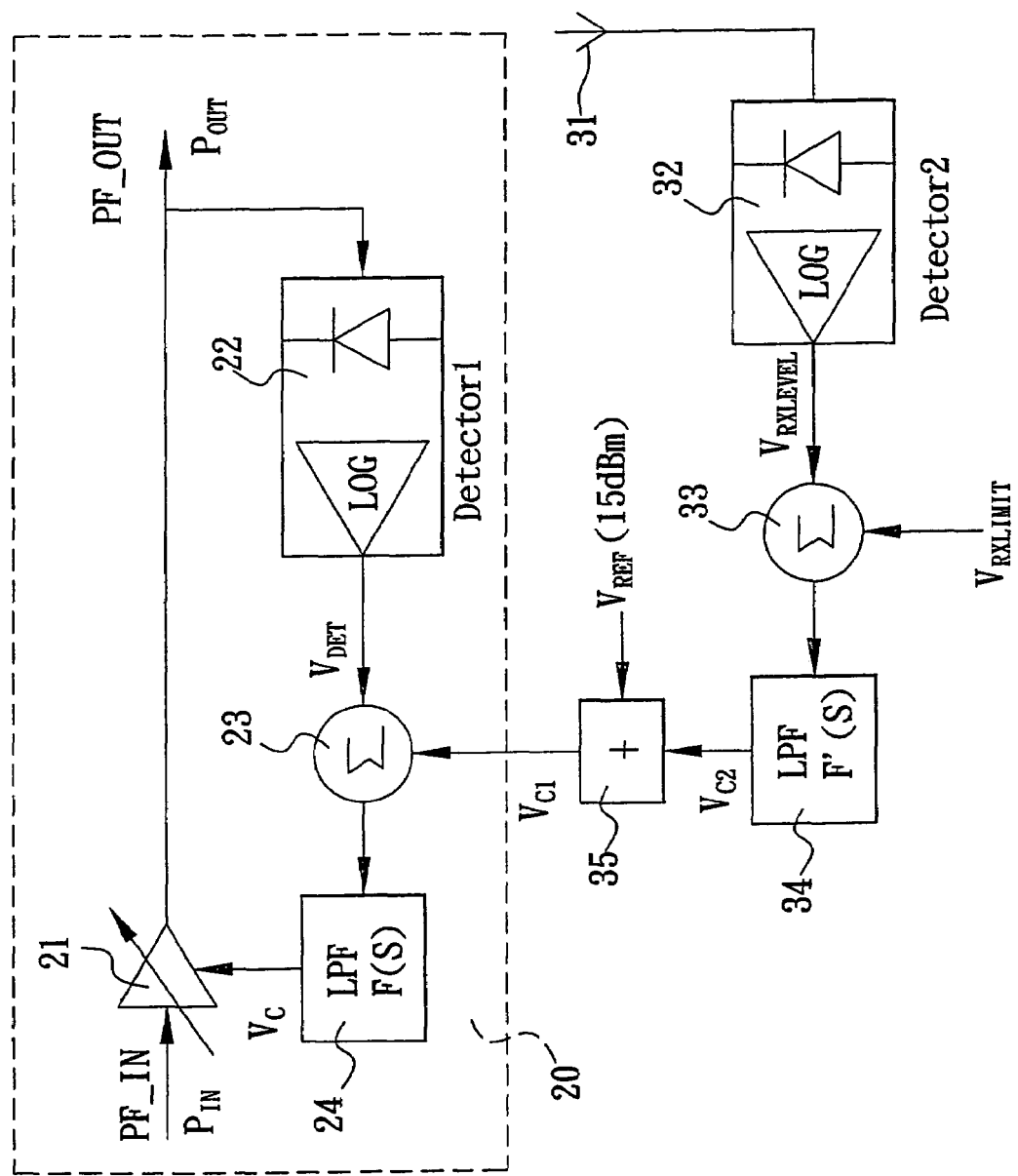
FIG. 2 illustrates a auto-gain control circuit of a Wi-Fi communication device of the present invention.

Referring to FIG. 2, a dynamic power control circuit of a wireless communication device is illustrated. The wireless communication device comprises a radio frequency (RF) auto-gain control circuit 20. The auto-gain control circuit 20 includes a dynamic gain power amplifier 21, a power detector 22, a comparator 23, and a low pass filter 24, wherein another power detector 32, another comparator 33, another low pass filter 34 and an adder 35 are disposed between the comparator 23 and the antenna 31 of the wireless communication device. A reference voltage $V_{REF}$ (15 dBm) is imposed on the adder 35, so as to enable the detector 22 to detect the output power $P_{OUT}$ of the amplifier 21. After the detection of the detector 22, an output voltage $V_{DET}$ is generated. The output voltage $V_{DET}$ is further inputted to the comparator 23, and is compared with another reference voltage $Vc_1$ from the adder 35. Later, the filter 24 filters out the noise of the control voltage Vc output from the comparator 23, thereby making the control voltage Vc being the value of gain amplification of the amplifier 21.

Referring again to FIG. 2, according to the combination described above, the another power filter 32 can detect the signal voltage received from the antenna 31, and output a received voltage $V_{RXLEVEL}$ to the another comparator 33. The another comparator 33 then compares the received voltage $V_{RXLEVEL}$ with a specified received voltage limit $V_{RXLIMIT}$. A reference voltage $Vc_2$ is outputted to the another low pass filter 4, so as to filter out the noise of the reference voltage $Vc_2$. The reference voltage $Vc_2$ is then outputted to the adder 35. The adder 35 adds the reference voltage V2c and the specified reference voltage $V_{REF}$ (15 dBm), and outputs another reference voltage $Vc_1$ to the comparator 23. In this manner, the auto-gain control circuit 20 can control the output power in accordance to the strength of the received signals. When the received signals are weak, the output power is increased correspondingly, so as to enhance the connecting quality. When the received signals are strong, the output power is decreased correspondingly, so as to reduce to power consumption and increase the speaking time on the phone.

Referring again to FIG. 2, the basic principle of the auto-gain control circuit 20 is given in the following formulae:

1) Reference voltage $Vc_2 = F'(S) \times (V_{RXLIMIT} - V_{RXLEVEL})$; where $V_{RXLEVEL}$ is the received voltage from the antenna 31, $V_{RXLIMIT}$ is the specified received voltage limit, F'(S) is a function of the another low pass filter 34.

2) Another reference voltage $Vc_1 = Vc_2 + V_{REF}$ (15 dBm); where $V_{REF}$ is a specified reference voltage.

Therefore, the final control voltage is:

3) $Vc = F(S) \times (Vc_1 - V_{DET})$
$= F(S) \times (Vc_2 + V_{REF}(15\,dBm) - V_{DET})$
$= F(S) \times (F'(S) \times (V_{RXLIMIT} - V_{RXLEVEL}) + V_{REF}(15\,dBm) - V_{DET})$;

where the $V_{DET}$ is the output voltage from the detector 22.

According to the description set forth above, another term $F'(S) \times (V_{RXLIMIT} - V_{RXLEVEL})$ exists in the present invention than the conventional structure. That is, the result of comparison between the received voltage $V_{RXLEVEL}$ and the specified received voltage limit $V_{RXLIMIT}$. If the received voltage $V_{RXLEVEL}$ is smaller than the received voltage limit $V_{RXLIMIT}$, i.e. the received signal is weak, the control voltage Vc will include another term $F'(S) \times (V_{RXLIMIT} - V_{RXLEVEL})$, so as to make the emission power larger than 15 dBm, thereby enhancing the talk quality. If the received signal is strong for most of the time, the received voltage $V_{RXLEVEL}$ is larger than the received voltage limit $V_{RXLIMIT}$, making the term $F'(S) \times (V_{RXLIMIT} - V_{RXLEVEL})$ smaller than zero. Thus, the emission power is smaller than 15 dBm, so as to reduce the power consumption and increase the speaking time on the phone. Therefore, the present invention can adjust its output power following the change of the received voltage $V_{RXLEVEL}$, thereby reducing the power consumption and increasing the connecting quality.

While the invention has been described by means of specific embodiments, numerous modifications and variations could be made thereto by those skilled in the art without departing from the scope and spirit of the invention set forth in the claims.

What is claimed is:

1. A dynamic power control circuit for a wireless communication device, comprising:

a signal emission circuit comprising a radio frequency auto-gain control circuit, the auto-gain control circuit comprising a dynamic gain power amplifier, a power detector, a comparator, and a low pass filter, wherein the detector detects the output power of the amplifier and outputs a output voltage to the comparator, the comparator compares the output voltage with a reference voltage from an adder, and the filter filters out noise of control voltage output from the comparator, thereby making the control voltage to be a control value of gain amplification of the amplifier;

another power detector, another comparator, another low pass filter and the adder, being disposed between the comparator and an antenna of the wireless communication device, wherein a specified reference voltage is configured in the adder, whereby the another power detector detects signal voltage received by the antenna and outputs a received voltage to the another comparator, the another comparator compares the received voltage with a specified received voltage limit and outputs a reference voltage to the another low pass filter, the another low pass filter filters out noise of the reference voltage and then outputs the reference voltage to the adder, the adder adds the reference voltage and the specified reference voltage and outputs another reference voltage to the comparator.

2. The circuit of claim 1, wherein the specified reference voltage is 15 dBm.

* * * * *